(12) United States Patent
Hayashi et al.

(10) Patent No.: US 7,133,017 B2
(45) Date of Patent: Nov. 7, 2006

(54) SHIFT REGISTER AND DISPLAY DEVICE USING SAME

(75) Inventors: Shunsuke Hayashi, Tenri (JP); Seijirou Gyouten, Tenri (JP); Hajime Washio, Sakurai (JP); Eiji Matsuda, Tenri (JP); Sachio Tsujino, Yao (JP); Yuichiro Murakami, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 512 days.

(21) Appl. No.: 10/387,860

(22) Filed: Mar. 14, 2003

(65) Prior Publication Data

US 2003/0184512 A1 Oct. 2, 2003

(30) Foreign Application Priority Data

| | | |
|---|---|---|
| Mar. 26, 2002 | (JP) | 2002-087074 |
| Oct. 8, 2002 | (JP) | 2002-295420 |
| Dec. 20, 2002 | (JP) | 2002-370966 |

(51) Int. Cl.
*G09G 3/36* (2006.01)

(52) U.S. Cl. ............... 345/100; 377/72; 377/75

(58) Field of Classification Search .......... 345/98, 345/100; 377/64, 72, 75–78
See application file for complete search history.

(56) References Cited

U.S. PATENT DOCUMENTS 5,526,390 A * 6/1996 Fucili ............... 377/29
9,578,440      5/2000 Washio et al.
9,703,918     11/2000 Washio et al.
6,469,647 B1 * 10/2002 Kinugasa et al. ........... 341/145

FOREIGN PATENT DOCUMENTS

JP    2001-135093 A    5/2001

OTHER PUBLICATIONS

Korean Notice of Rejection and English translation thereof mailed Jun. 27, 2005 in corresponding Korean application No. 10-2003-18577.

* cited by examiner

*Primary Examiner*—Kent Chang
(74) *Attorney, Agent, or Firm*—Nixon & Vanderhye P.C.

(57) ABSTRACT

A shift register includes plural stages of flip-flops. The last-stage flip-flop Fn and the flip-flop Fn−1 that is the preceding flip-flop thereof are reset by inputting thereto an output signal from the last-stage flip-flop. A delaying means is provided, between an output terminal Q of the last-stage flip-flop for outputting the output signal and an input terminal R of the last-stage flip-flop for receiving the output signal, for delaying an input of the output signal to the input terminal R. The flip-flop Fn is reset at same time or after the preceding flip-flop Fn−1 is reset. With this arrangement, it is possible to prevent malfunctions of circuits due to a failure to reset the flip-flops.

20 Claims, 12 Drawing Sheets

SHIFT REGISTER AND DISPLAY DEVICE USING SAME

FIELD OF THE INVENTION

The present invention relates to a shift register preferably used, for example, in a driving circuit for a display device so as to realize prevention of malfunctions, and a display device using the same.

BACKGROUND OF THE INVENTION

As described in Japanese publication of unexamined patent application, Tokukai, No. 2001-307495 (Date of Publication: Nov. 2, 2001) and the like, shift registers have been widely used in data line (data signal line) driving circuits and gate line (scanning signal line) driving circuits, for timing in sampling data signals in each data line and for generating a scanning signal for each gate line, and the like.

In a data line driving circuit, a shift register outputs a sampling signal so as to write a video signal into each data line. Meanwhile, in the gate line driving circuit, the shift register outputs a scanning signal so as to sequentially write the video signal supplied to each data line into pixels arrayed in a display section.

The following describes the shift register. As shown in FIG. 11, the shift register includes plural stages of flip-flops that operate in synchronization with clock signals CK and CKB.

The flip-flops shown in FIG. 11 are set-reset type flip-flops (SR flip-flops). For example, an output from an (i+1)th (here, $2 \leq i+1 \leq n$; i is an integer number) flip-flop Fi+1 is inputted to a reset terminal R of a preceding (i-th) flip-flop Fi as a reset signal.

In general, a flip-flop is a circuit that switches over between two stable states every time a signal is inputted with certain timing, and stays in one of the stable states while no signal is inputted.

Specifically, in the SR flip-flops (hereinafter the flip-flops), for example, an output from an i-th flip-flop Fi is switched to be in a low state when a set signal (that is, a low output (an output signal) from an (i−1)th flip-flop Fi−1) and a low clock signal CK or CKB synchronized with the i-th flip-flop Fi are inputted to the i-th flip-flop Fi. The output from the i-th flip-flop Fi stay in the state even if the set signal inputted becomes non-active.

Thereafter, when the set signal inputted is non-active and, for example, a reset signal from the (i+1)th flip-flop Fi+1 becomes active, the output of the flip-flop Fi transits to a high state. After that, even if the reset signal from the (i+1)th flip-flop Fi+1 becomes non-active, the state is kept until the set signal inputted becomes active.

Then, the (i+1) the flip-flop Fi+1 is set when the output from the flip-flop Fi+1 is in a low state. The output from the flip-flop Fi+1 is switched to the low state in accordance with timings of the clock signals CK and CKB that are synchronized with the (i+1)th flip-flop Fi+1. When a reset signal (an output signal) from an (i+2) th flip-flop Fi+2 becomes active, the output of the (i+1)th flip-flop Fi+1 transits to the high state.

Thereafter, even if the reset signal from the (i+2)th flip-flop Fi+2 becomes non-active, the state is kept until the set signal inputted becomes active.

Thus, a pulse is shifted through the flip-flops in accordance with outputs of set signals S from preceding flip-flops and reset signals R from following flip-flops.

Each output signal from the flip-flops is outputted as the set signal for the following flip-flop thereof, and inputted to the preceding flip-flop thereof as the reset signal for resetting the preceding flip-flop.

Thus, the flip-flops that have outputted signals are reset as the pulse is shifted through the flip-flops.

Then, an output signal from a last-stage flip-flop Fn is inputted to an (n−1)th flip-flop Fn−1 so as to reset the (n−1)th flip-flop Fn−1, and is inputted to the flip-flop Fn so as to reset the flip-flop Fn.

In short, the last-stage flip-flop Fn supplies the output signal to the preceding flip-flop Fn−1 and to itself (the last-stage flip-flop Fn) as reset signals therefor.

Thus, it is necessary to stop (self-reset) operation of the last-stage flip-flop Fn by using the output signal from the last-stage flip-flop Fn itself. Therefore, such operation control of self-reset is necessary.

Liquid crystal image display devices have been widely used recently as display devices for small portable terminals and for mobile phones. Furthermore, because infrastructures for communications have been improved, broadband has become common, thereby increasing amount of information.

For the above reasons, it is strongly desired that display sections of the small portable terminals and the mobile phones have large display capacity so that more information can be displayed in a screen.

If the display capacity becomes large, data clock speed becomes very high. For example, where a frame frequency is 60 Hz, data rate is about 25 MHz for displaying VGAs (video graphics arrays), whilst the data rate is 75 MHz for displaying SXGAs (super extended graphics arrays).

However, if the display capacity becomes large, for example, it is necessary that circuit operation in a circuit part in the image display device be carried out at high speed. In such a case, there is a fear that delay in the circuits may cause malfunctions of the circuits.

For example, where the shift register includes the flip-flops F1 to Fn shown in FIG. 11, there is a case in which the reset signal is not supplied in a right timing, the reset signal being supplied, from the n-th flip-flop Fn, for stopping (resetting) operation of the (n−1)th flip-flop Fn−1. In this case, it is failed to stop the operation of the (n−1)th flip-flop Fn−1.

More specifically, due to capacitance, resistance, and the like of the wires through which the output signal from the n-th flip-flop Fn is inputted to the (n−1)th flip-flop Fn−1 as the reset signal, or because a driving frequency becomes higher, the last-stage (n-th) flip-flop Fn is reset before the (n−1)th flip-flop Fn−1 is reset by the output signal from the flip-flop Fn as the reset signal having enough driving capability.

Because of this, the last-stage flip-flop Fn stops operating before the (n−1)th flip-flop Fn−1 stops operating, whereby the reset signal is not inputted to the (n−1)th flip-flop Fn−1. This leads to, as shown in FIG. 12, failure of resetting the (n−1)th flip-flop Fn−1.

In other words, because the (n−1)th flip-flop Fn−1 keeps operating without being reset, a desired sampling waveform cannot be obtained at a last data line (that receives a last data signal in one horizontal period) in the data driving circuit.

Moreover, in the gate (scanning) driving circuit, a desired scanning signal for sequentially writing video signals in the pixels arrayed at the display section cannot be obtained in a last gate line (that receives a last scanning signal in one frame period).

Furthermore, in case of a shift register capable of performing scanning in two directions, last-stage flip-flops in each scanning direction (those flip-flops that reset themselves and the preceding flip-flops thereof) are at both ends of the shift register.

In such an arrangement, floated are set terminals S and reset terminals R of the flip-flops that contribute only to scanning in one of the directions (a leftmost flip-flop in case of a scanning in a rightward direction and a rightmost flip-flop in case of a scanning in a leftward direction).

When the input terminals are floated, potential of the input terminals become unstable, and there is a fear that the flip-flops are set at certain moment and start operating.

In this case the flip-flops that are set are instantly reset by their own resetting function. However, the flip-flops thus reset are again floated. Thus, the flip-flops that are set again. The flip-flops keep always operating because the flip-flops are set and then reset again and again.

SUMMARY OF THE INVENTION

A primary object of the present invention is to provide a shift register that can prevent malfunctions of circuits caused because flip-flops are not reset, and to provide a display device using the shift register.

To solve the problems above, the shift register of the present invention includes plural stages of flip-flops, some of the flip-flops and the last-stage flip-flop being reset by inputting thereto an output signal from the last-stage flip-flop, wherein the last-stage flip-flop is reset at same time or after the some of the flip-flops are reset.

For example, the shift register of the present invention includes plural stages of flip-flops, the last-stage flip-flop and the preceding flip-flop thereof being reset by inputting thereto an output signal from the last-stage flip-flop, wherein the last-stage flip-flop is reset at same time or after the preceding flip-flop thereof is reset.

Moreover, to solve the problems above, the display device of the present invention includes a plurality of gate lines, a plurality of data lines positioned orthogonal to the plurality of gate lines, switching elements provided in vicinities of intersections between the plurality of gate lines and the plurality of data lines, each of the switching elements corresponding to a pixel, a gate driving circuit for supplying a scanning signal for driving pixels to the plurality of gate lines, and a data driving circuit for supplying a data signal for the pixels to the plurality of data lines, at least one of the gate driving circuit and the data driving circuit including the shift register wherein the last-stage flip-flop is reset at same time or after the some of the flip-flops are reset.

According to the arrangement above, the last-stage flip-flop is never reset before the other flip-flops (for example, the preceding flip-flop of the last-stage flip-flop). Therefore, it is possible to prevent malfunctions in circuits, for example, such malfunctions in which the other flip-flops (for example, the preceding flip-flop of the last-stage flip-flop) keep operating without being reset.

Therefore, it is possible, for example, to provide a display device including the shift register in the data driving circuit, the gate driving circuit, and the like, wherein malfunctions do not occur, and a desired sampling waveform, a desired scanning signal, and the like, can be obtained.

Furthermore, the above display device attains lower electric power consumption by including the above shift register in at least one of the data driving circuit and the gate driving circuit. Moreover, it is possible to reduce a circuit size of the shift register, thereby reducing a size of a frame portion of the display device.

The shift register of the present invention includes plural stages of flip-flops, some of the flip-flops and the last-stage flip-flop being reset by inputting thereto an output signal from the last-stage flip-flop, the shift register being capable of scanning in two directions, and one or some of the flip-flops that output no signal out of the shift register including a stopping means for preventing themselves from operating.

Moreover, to solve the problems above, the display device of the present invention includes a plurality of gate lines, a plurality of data lines positioned orthogonal to the plurality of gate lines, switching elements provided in vicinities of intersections between the plurality of gate lines and the plurality of data lines, each of the switching elements corresponding to a pixel, a gate driving circuit for supplying a scanning signal for driving pixels to the plurality of gate lines, and a data driving circuit for supplying a data signal for the pixels to the plurality of data lines, at least one of the gate driving circuit and the data driving circuit being capable of scanning in two directions by using the same plural stages of flip-flops, and one or some of the flip-flops that output no signal out of the shift register including a stopping means for preventing themselves from operating.

According to the arrangement above, the one or some of the flip-flops that output no signal out of the shift register (for example, the leftmost flip-flop in case of the scanning in the rightward direction) is stopped.

Moreover, transistors to which the signals are inputted properly operate because input terminals (set terminals and reset terminals) of outmost flip-flops (for example, the leftmost flip-flop in case of the scanning in the rightward direction) are never floated.

For a fuller understanding of the nature and advantages of the invention, reference should be made to the ensuing detailed description taken in conjunction with the accompanying drawings.

DESCRIPTION OF THE EMBODIMENTS

[Embodiment 1]

Referring to FIGS. 1 to 6, the following describes an embodiment of the present invention.

Figure 2:
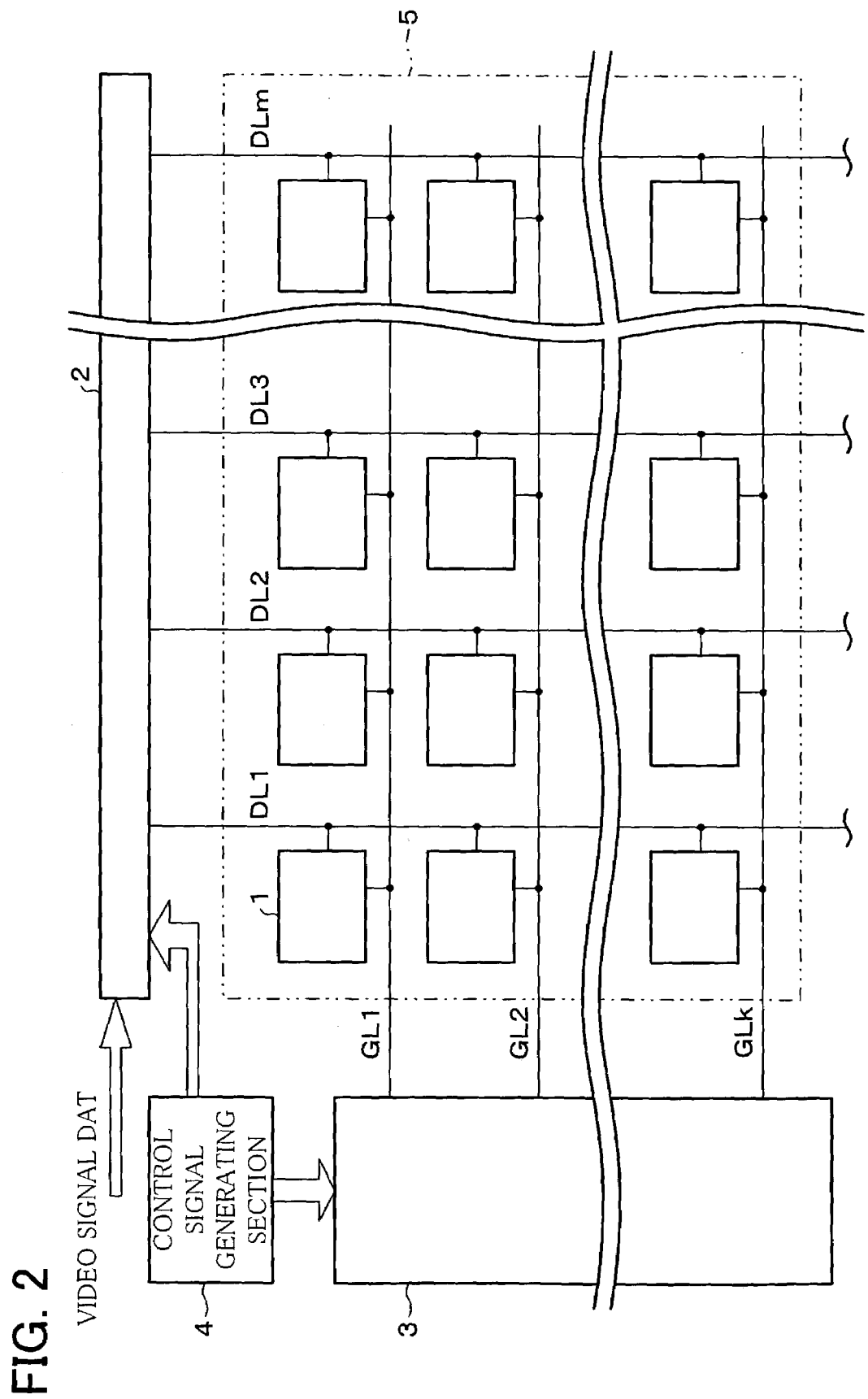
FIG. 2 illustrates an arrangement of a main part of an image display device having the shift register shown in FIG. 1.

FIG. 2 shows an arrangement of main sections of an image display device (a display device) of the present embodiment. As shown in FIG. 2, the image display device includes, on a glass substrate (not shown), pixels 1, driving circuits 2 and 3, and a control section (a control signal generating section) 4.

The pixels 1 are arranged in matrix and constitute a display section 5. The driving circuits 2 and 3 have shift registers composed of flip-flops (F1 to Fn) and drive the pixels 1. An arrangement of the shift registers is described later. The control section 4 generates signals (a start pulse signal and a clock signal) that are to be inputted to the driving circuits 2 and 3.

The driving circuit (a data driving circuit) 2 is connected to data lines DL1 to DLm (DLi); the driving circuit (a gate driving circuit) 3 is connected to gate lines GL1 to GLk (GLj).

The data line DLi ($1 \leq i \leq m$) and the gate line GLj ($1 \leq j \leq k$) are electrode wires arranged in matrix. In vicinity of intersecting points (intersections) of the data line DLi and the gate line GLj, for example, thin film transistors (not shown, hereinafter TFTs) are provided, which are switching elements whose gates are connected to the gate line GLj and whose sources are connected to the data line DLi, for example.

The TFTs are turned ON and OFF so as to control whether or not a signal from the control section 4 is transmitted to pixels 1. The TFTs are made of polycrystalline silicon.

Each pixel 1 includes the TFT and a pixel capacitor, one of two electrodes of which is connected to a drain of the TFT.

The display section 5 and the driving circuits 2 and 3 are monolithically formed on a single glass substrate. Because of this, manufacturing steps and wire capacitance can be reduced.

The TFTs can be manufactured at a process temperature of 600° C. or lower because the TFTs are made of polycrystalline silicon. Therefore, even if a typical glass substrate is used, a distortion temperature of which is 600° C. or lower, it is possible to prevent warpage and bowing of the substrate, which are due to a process temperature of more than the distortion temperature.

Moreover, a glass substrate is inexpensive. Further, a substrate having large area can be easily manufactured from a glass substrate. Because of this, a large number of panels can be manufactured from a single substrate having large area. Therefore, it is possible to provide an inexpensive image display device.

Moreover, because the TFTs composed of polycrystalline silicon are used as the switching elements, the TFTs have a large size. Therefore, it is possible to enlarge display area of the display section 5.

In addition, one of the two driving circuits 2 and 3 and display section may be provided on the single substrate.

In other words, in the image display device, it is preferred that at least one of the two driving circuits 2 and 3, and the TFTs are provided on the single substrate.

When at least one of the two driving circuits 2 and 3 and the TFTs are provided on the single substrate, even if the number of signal wires (the data lines and the gate lines) between the driving circuit and the pixels on the single substrate is increased, it is not necessary to extend the signal wires out of the substrate because the signal wires are provided on the single substrate. Moreover, steps of preparing the driving circuit and the TFTs on separate substrates and assembling the substrates are no longer necessary.

Therefore, wire capacitance for signals and the steps of manufacturing the image display device can be reduced.

Figure 1:
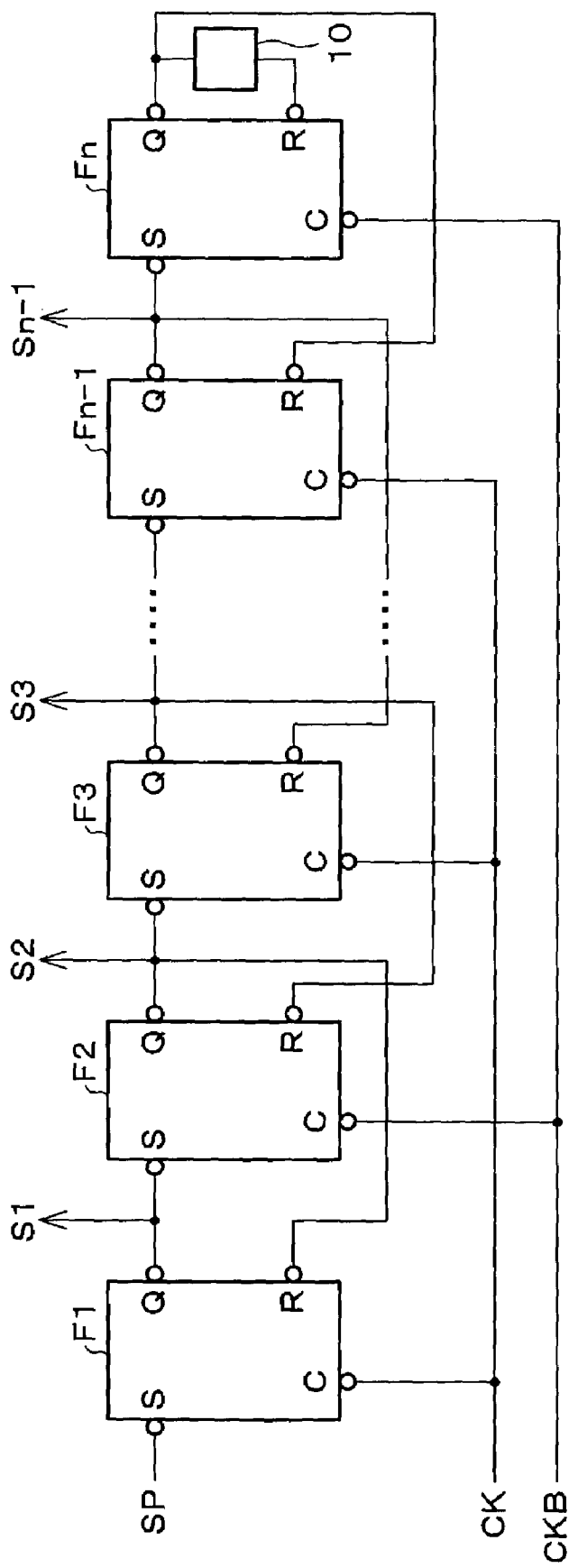
FIG. 1 is a block diagram illustrating an arrangement of a main part of a shift register of an embodiment of the present invention.

Referring to FIG. 1, the following describes an example of an arrangement of the shift register in the driving circuit 3.

The flip-flops F1 to Fn (here, n is an even number) are composed of set-reset flip-flops (SR flip-flops). Into the shift register, a start pulse SP, clock signals CK and CKB are inputted, which are generated in the control section 4. Corresponding input terminals and output terminals between the flip-flops F1 to Fn and between the flip-flops F1 to Fn and the control section 4 are connected with each other by wires.

The number of the flip-flops in the shift register is not particularly limited as long as the number is plural.

Between an output terminal Q of a last-stage flip-flop Fn and a reset terminal R of the last-stage flip-flop Fn, that is, in a circuit for a reset signal to the last-stage flip-flop Fn supplied from the last-stage flip-flop Fn itself, a CMOS inverter (see FIG. 3) is provided, which is a delaying circuit (a delaying means) 10, in order to delay an input of the reset signal into the reset terminal R.

The following describes operation of the flip-flops F1 to Fn in the shift register.

The clock signal CK is supplied to clock input terminals C of flip-flops F1, F3, . . . , Fn−1 (odd number stages of the flip-flops). The clock signal CKB in a reverse phase of the clock signal CK is supplied to clock input terminals C of flip-flops F2, F4, . . . , Fn (even number stages of the flip-flops).

The start pulse SP is inputted into a set terminal S of the first stage, that is, the flip-flop F1. Then, an output signal (pulse) S1 is outputted from an output terminal Q of the flip-flop F1. The output signal S1, via the gate line GLj corresponding to the flip-flop F1, turns ON the TFTs connected to the gate line GLj, and is inputted into a set terminal S of a following flip-flop F2 as a set signal.

Next, an output signal S2 is outputted from an output terminal Q of the flip-flop F2. In a manner similar to the output signal S1 from the flip-flop F1, the output signal S2 turns ON the TFTs connected to the corresponding gate line GLj, is inputted into a set terminal S of a following flip-flop F3 as a set signal, and is inputted into a reset terminal R of the preceding flip-flop F1 as a reset signal.

Likewise, output signals S3 to Sn−1 are respectively outputted from output terminals Q of flip-flops F3 to Fn−1, and inputted into set terminals S of following flip-flops F4 to Fn as set signals and into reset terminals R of preceding flip-flops F2 to Fn−2 as reset signals.

An output signal Sn is outputted from the output terminal Q of the flip-flop Fn. The output signal Sn is inputted into a reset terminal R of a flip-flop Fn−1 as a reset signal for the preceding flip-flop Fn−1, and inputted into a reset terminal R of the flip-flop Fn as a reset signal for the flip-flop Fn itself.

Figure 3:
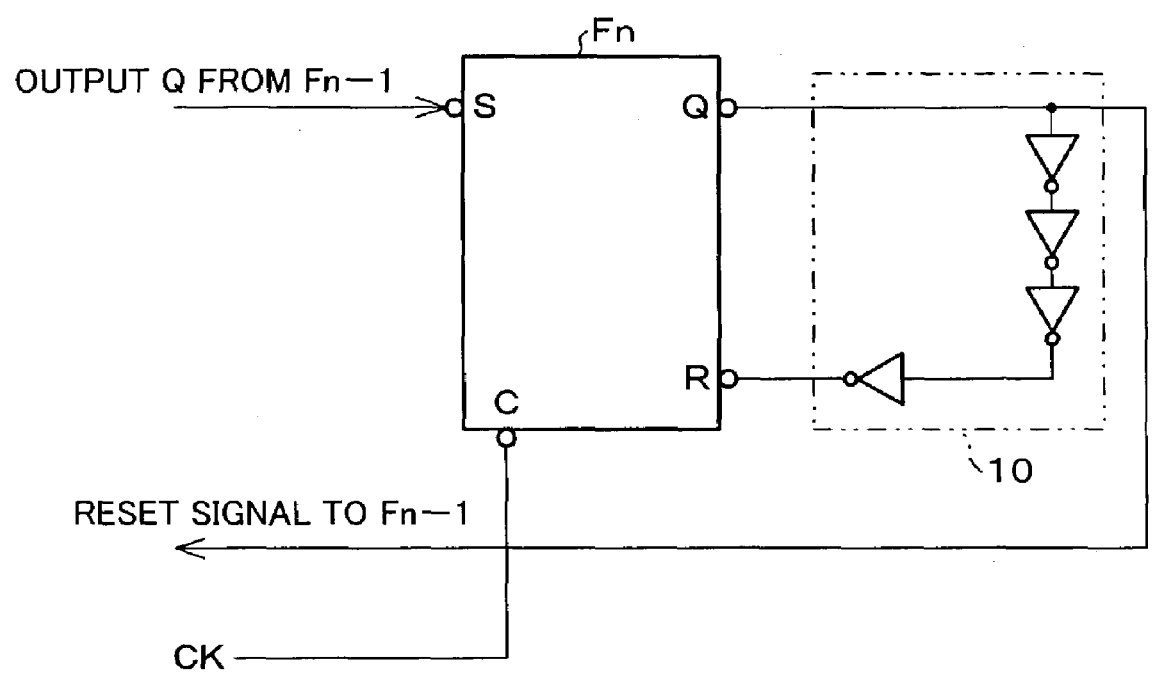
FIG. 3 is a block diagram illustrating an arrangement of a delaying circuit having CMOS inverters.

For the last-stage flip-flop Fn, the CMOS inverter (the inverter) is provided between the output terminal Q and the reset terminal R as the delaying circuit 10 as shown in FIG. 3.

By passing the reset signal Sn through the inverter, an input waveform of the output signal Sn as a reset signal (hereinafter the reset signal Sn) is rounded (that is, the input waveform is caused to have round corners instead of sharp corners.). Because of this, the reset signal Sn is delayed, thereby delaying input of the reset signal Sn into the reset terminal R of the flip-flop Fn itself, compared with a case in which the inverter is not provided.

A delay time of the reset signal Sn for which the reset signal Sn is delayed can be set arbitrarily by changing channel width or channel length of n-type transistors or p-type transistors in the inverter.

When the reset signal Sn is low, for example, the channel width or the channel length of the transistors are set so that characteristics of the p-type transistors are changed (e.g. increase a resistance value and decrease amount of current passing through a channel) in order to cause a smaller rise in the waveform in a first-stage inverter and that characteristics of the n-type transistors are changed (e.g. increase a resistance value and decrease amount of current passing through a channel) in order to cause a smaller fall in the waveform in a second-stage inverter.

The channel width and the channel length may be set with respect to each inverter according to a desired delay time. The number of inverters is not particularly limited. Thus, the number of inverters may be set according to the desired delay time.

Figure 6:
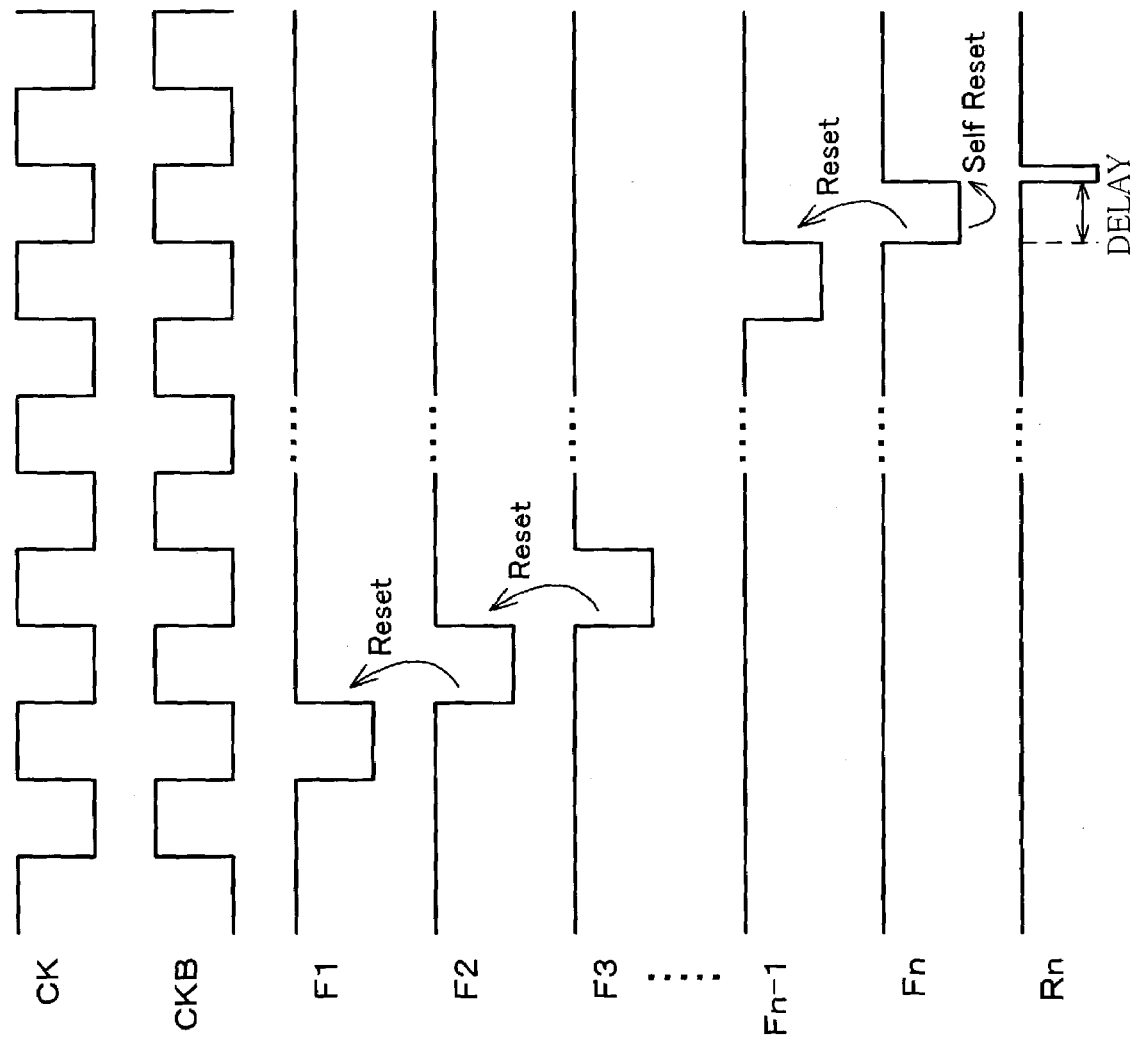
FIG. 6 is a timing chart illustrating operation of the shift register shown in FIG. 1.

Therefore, as shown in FIG. 6, the flip-flop F1 is set at a timing at which the clock signal CK rises while the start pulse SP is high level and active. The rest of flip-flops F2 to Fn are set every half cycle of the clock signal CK, thereby the pulse is sequentially shifted.

In other words, the flip-flops F1 to Fn−1 are respectively reset by outputs from their following flip-flops F2 to Fn−2 when the following flip-flops F2 to Fn−2 are set.

Right after the last-stage flip-flop Fn outputs the output signal Sn for the last-stage flip-flop Fn itself, the last-stage flip-flop Fn is reset by the output signal Sn.

In other words, the last-stage flip-flop Fn is set when an output signal Sn−1 of a flip-flop Fn−1 becomes low. Then, an output signal Sn of a last-stage shift register Fn becomes low in synchronization with the clock signal CKB. At this time, as described above, the output signal Sn is inputted into the reset terminal R of the flip-flop Fn−1 as a reset signal to the flip-flop Fn−1 and inputted into the reset terminal R of the last-stage flip-flop Fn as a reset signal to the last-stage flip-flop Fn itself.

Here, for example, when the flip-flop Fn−1 is not reset because the last-stage flip-flop Fn stops (and is reset) earlier than the flip-flop Fn−1, the flip-flop Fn−1 keeps operating so that a desired scanning signal cannot be obtained in the gate line GLj corresponding to the flip-flop Fn−1.

However, by providing the delaying circuit 10 as described above, the last-stage flip-flop Fn is reset at same time or after the flip-flop Fn−1, which is a preceding flip-flop of the last-stage flip-flop Fn, is reset.

In other words, the flip-flop Fn−1, which is the preceding flip-flop of the last-stage flip-flop Fn, is reset before the last-stage flip-flop Fn is reset.

Because of this, it is possible to prevent malfunctions of the shift register. Therefore, for example, it is possible to provide an image display device in which a desired scanning signal can be obtained because malfunctions do not occur in the circuits. As a result, it is possible to provide an image display device of a high display quality.

Moreover, the delaying circuit 10 is not limited to a particular kind as long as, as described above, the delaying circuit 10 can delay the reset signal R to the last-stage flip-flop Fn outputted from the last-stage flip-flop Fn itself, so that the last-stage flip-flop Fn does not stop operating before the flip-flop Fn−1 stops operating. For example, the delaying circuit 10 may be composed of by combining any ones or all of a wire resistor, a wire capacitor, and an inverter.

Furthermore, the number of inverters used in combination is not particularly limited.

Figure 4:
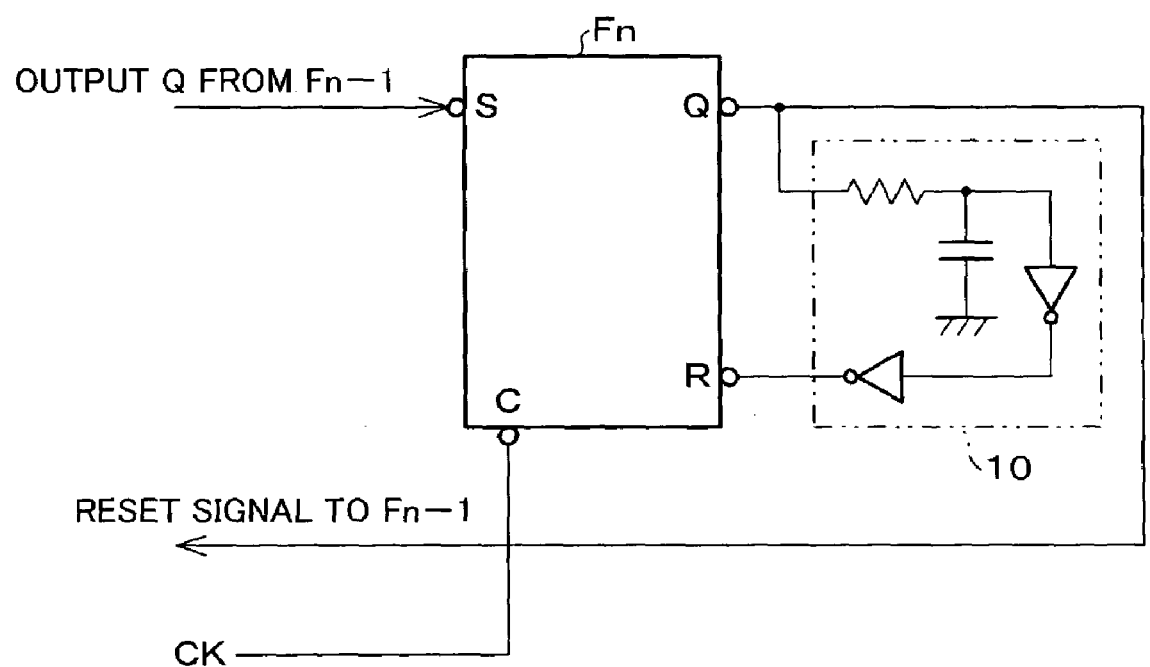
FIG. 4 is a block diagram illustrating an arrangement of a delaying circuit having a wire resistor, a wire capacitor, and CMOS inverters.

FIG. 4 shows an example in which a wire resistor, a wire capacitor, and two stages of inverters are provided for the delaying circuit 10. In such a case, the delay time, for which a reset signal Sn is delayed, can be changed by adjusting area and length of wiring.

Figure 5:
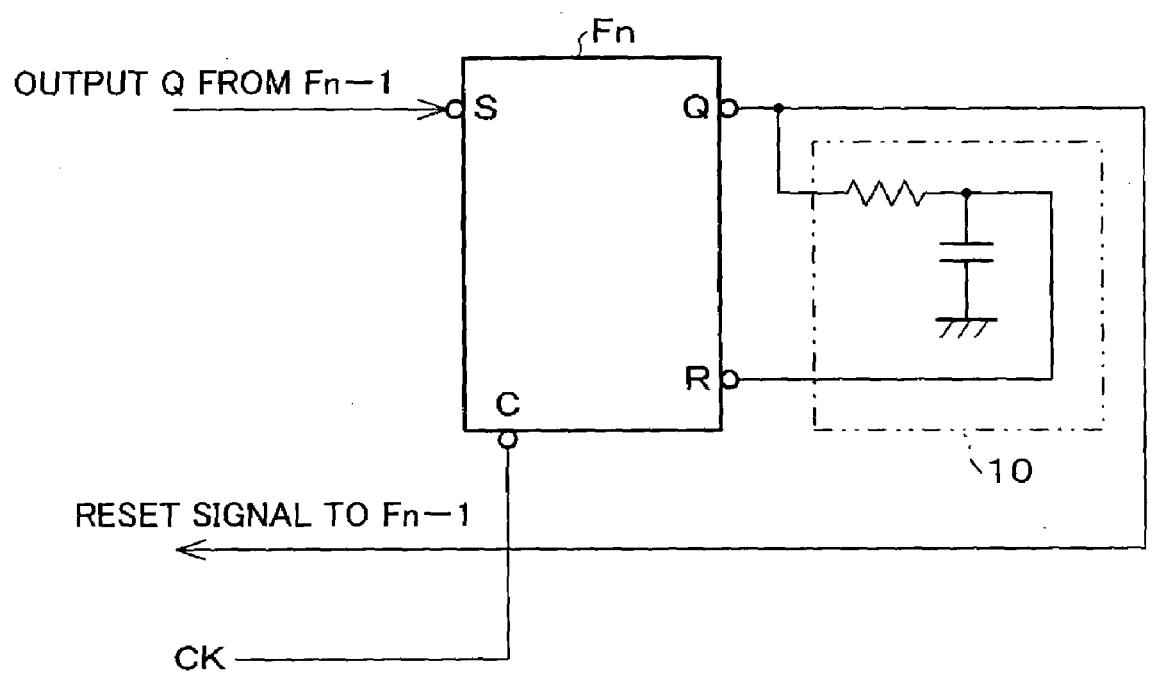
FIG. 5 is a block diagram illustrating an arrangement of a delaying circuit having a wire resistor and a wire capacitor.

FIG. 5 shows an example in which a wire resistor and a wire capacitor are provided as the delaying circuit 10. In such a case, the delay time, in which the reset signal Sn is delayed, can be changed by adjusting area and length of wiring.

The following describes how displaying is performed in the image display device.

The image display device displays images at the display section 5 by sampling a video signal DAT at the driving circuit 2 and supplying the sampled DAT to the pixels 1 via the data lines DL1 to DLm.

For example, when the gate line GL1 is scanned in a horizontal direction, a gate voltage for turning ON the TFTs is applied to the gate line GL1. At the same time, gate voltages for turning OFF the TFTs is applied to the other gate lines GL2, GL3, . . . , GLk. Thus, when the gate line GL1 is scanned in the horizontal direction, only the TFTs of the gate line GL1 are turned ON, and the video signal DAT sampled via the data lines is supplied to the pixels 1 on the gate line GL1. The pixel is held during one frame period in which the whole display section 5 (a display screen) is thoroughly scanned once (until a next gate voltage is applied). Note that in the one frame period one display screen is thoroughly scanned once from top to bottom in a vertical direction in the display section 5.

Thus, it is possible to display all necessary pixels by sequentially scanning the gate lines from the gate line GL1 while applying, to all the data lines DL1 to DLm, signal voltages (data signals) suitable for driving states of each pixel of the data lines DL1 to DLm.

Here, the video signal DAT to each pixel is transmitted from the control section 4 to the data driving circuit 2 in a time-sharing manner. The data driving circuit 2 extracts, from the video signal DAT, video data that is to be supplied to each pixel at a timing in accordance with the clock signals CK and CKB, which are used as timing signals having predetermined cycles, and the start pulse SP.

Specifically, the shift register generates output signals, timings of which are different by having predetermined intervals therebetween, by sequentially shifting the start pulse SP in synchronization with the clock signals CK and CKB from the control section 4. The shift register samples the video signal DAT at timings indicated by the output signals, and outputs the sampled video signal DAT into the data lines DL1 to DLm.

Similarly, in the gate driving circuit 3, the shift register generates scanning signals (corresponding to the output signals S1 to Sn−1), timings of which are different by having predetermined intervals therebetween, by sequentially shifting the start pulse SP in synchronization with the clock signals CK and CKB from the control section 4, and outputs the scanning signals into the gate lines GL1 to GLk.

As described above, in case the driving circuit 3 includes the shift register, it is possible to reset all the flip-flops F1 to Fn of the shift register in the driving circuit 3. In other words, it is possible to prevent malfunctions of the circuits, which keeps running the flip-flop Fn−1, which is the preceding flip-flop of the last-stage flip-flop Fn.

Therefore, it is possible to obtain a desired scanning signal for the last gate line GLk, so as to drive the pixels 1.

Moreover, in case the driving circuit 2 includes the shift register, it is possible to reset all the flip-flops of the shift register in the driving circuit 2. In other words, it is possible to prevent malfunctions of the circuits, which keeps running the preceding flip-flop of the last-stage flip-flop.

Therefore, it is possible to obtain a desired sampling waveform of the data signal for the last data line DLm.

Furthermore, it is possible to reduce electric power consumption in the image display device. It is also possible to reduce a circuit size of the shift register, thereby reducing a size of a frame portion of the image display device.

Although the shift register is provided in both the driving circuits 2 and 3 in the present embodiment, the present invention is not limited thereto. For example, the present invention may be so arranged that the shift register is provided to one of the two driving circuits.

Moreover, the number of flip-flops reset by the last-stage flip-flop Fn is not particularly limited; the present invention may not be so arranged that the last-stage flip-flop Fn resets two flip-flops including the last-stage flip-flop Fn itself (the flip-flop Fn and the flip-flop Fn−1). For example, the following Embodiment 2 describes, as an example, a case in which the last-stage flip-flop Fn resets three flip-flops including the last-stage flip-flop Fn itself (the flip-flops Fn−2 to Fn).

[Embodiment 2]

Figure 7:
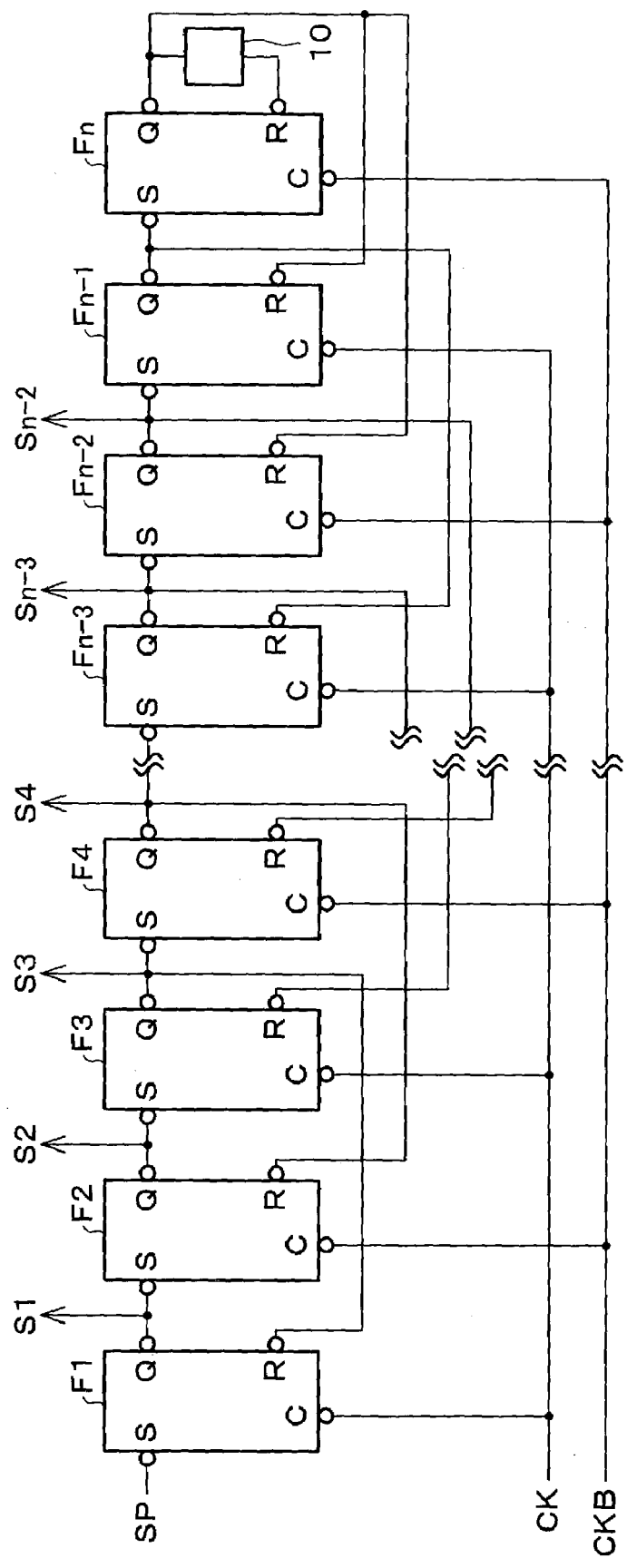
FIG. 7 is a block diagram illustrating an arrangement of a main part of a shift register of another embodiment of the present invention.
Figure 8:
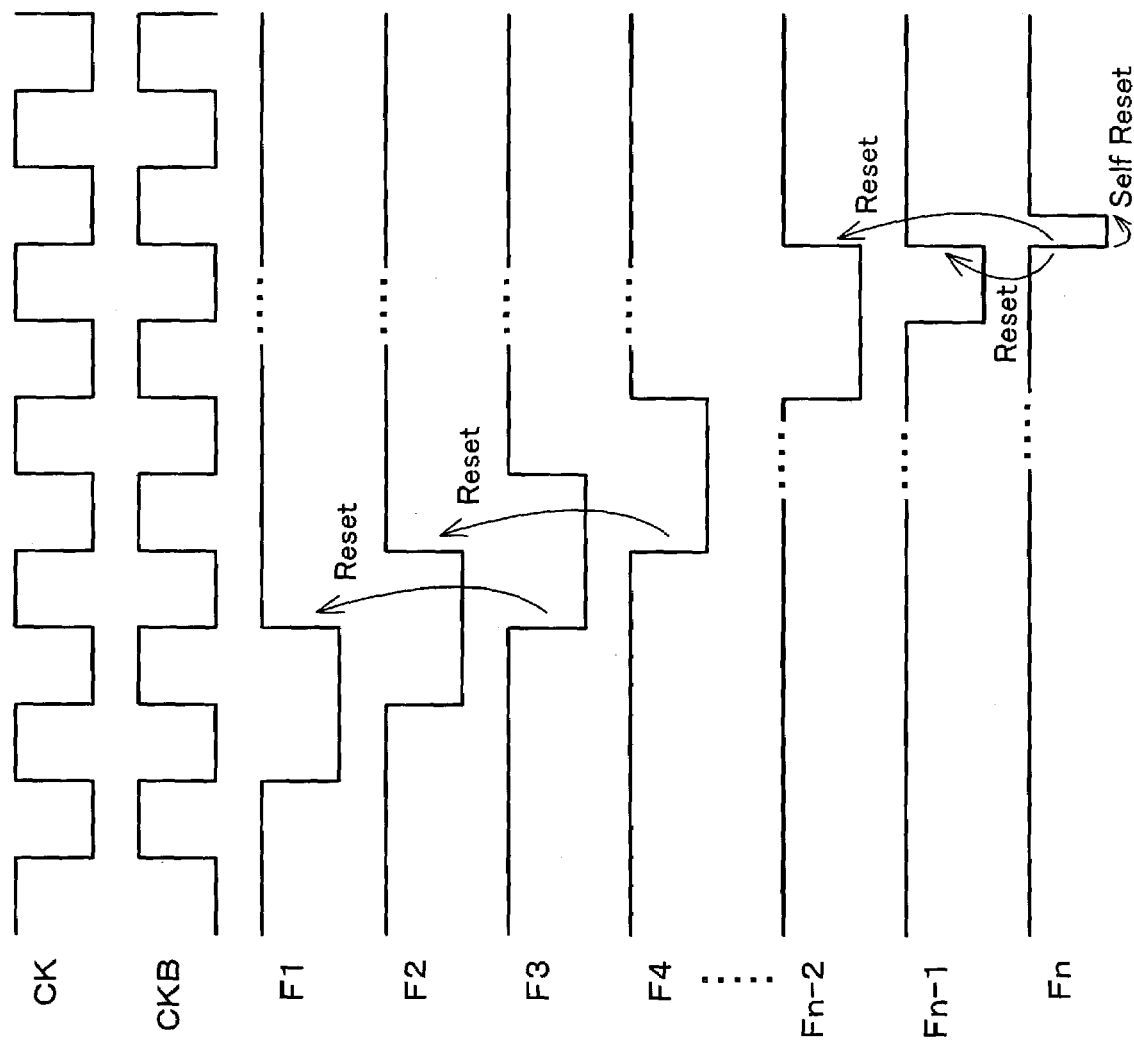
FIG. 8 is a timing chart illustrating operation of the shift register shown in FIG. 7.

Referring to FIGS. 2, 7 and 8, the following describes another embodiment of the present invention. In the present embodiment, constituents having functions equivalent to those of the constituents of Embodiment 1 are labeled with the same referential numerals, and explanations thereof are omitted.

The following describes one example of an arrangement of a shift register in a driving circuit 3 (see FIG. 2).

Flip-flops F1 to Fn (here, n is an even number) are composed of set-reset flip-flops (SR flip-flops) as in Embodiment 1. Into the shift register, a start pulse SP, clock signals CK and CKB are inputted, which are generated in a control section 4 (see FIG. 2). Corresponding input terminals and output terminals of each of flip-flops F1 to Fn and the control section 4 are connected by wires.

The number of the flip-flops in the shift register is not particularly limited as long as the number is plural.

Between an output terminal Q of a last-stage flip-flop Fn and a reset terminal R of the last-stage flip-flop Fn, that is, in a circuit for a reset signal to the last-stage flip-flop Fn supplied from the last-stage flip-flop Fn itself, a CMOS inverter (see FIG. 3) is provided, which is a delaying circuit (a delaying means) 10, in order to delay an input of the reset signal into the reset terminal R.

The following describes operation of the flip-flops F1 to Fn in the shift register.

The clock signal CK is supplied to clock input terminals C of flip-flops F1, F3, . . . , Fn−1 (odd number stages of the flip-flops). The clock signal CKB in a reverse phase of the clock signal CK is supplied to clock input terminals C of flip-flops F2, F4, . . . , Fn (even number stages of the flip-flops).

The start pulse SP is inputted into a set terminal S of the first stage, that is, the flip-flop F1. Then, an output signal (pulse) S1 is outputted from an output terminal Q of the flip-flop F1. The output signal S1, via the gate line GLj corresponding to the flip-flop F1, turns ON the TFTs connected to the gate line GLj, and is inputted into a set terminal S of a following flip-flop F2 as a set signal.

Next, an output signal S2 is outputted from an output terminal Q of the flip-flop F2. In a manner similar to the output signal S1 from the flip-flop F1, the output signal S2 turns ON the TFTs connected to the corresponding gate line GLj, and is inputted into a set terminal S of a following flip-flop F3 as a set signal.

Thereafter, an output signal S3 is outputted from an output terminal Q of the flip-flop F3. The output signal S3 turns ON the TFTs connected to the corresponding gate line GLj and inputted into a set terminal S of a following flip-flop F4 as a set signal, so as to be inputted into a reset terminal R of the flip-flop F1, which is the flip-flop before a preceding flip-flop of the flip-flop F3, as a reset signal.

Likewise, output signals S4 to Sn−2 are respectively outputted from output terminals Q of flip-flops F4 to Fn−2, thereby turning ON the TFTs connected to the corresponding gate line GLj. The output signals S4 to Sn−2 are then inputted into set terminals S of the following flip-flops F5 to Fn−1 as set signals and into reset terminals R of the flip-flops before preceding flip-flops to them, that is, the flip-flops F2 to Fn−4, as reset signals.

Then, an output signal Sn−1 is outputted from the output terminal Q of the flip-flop Fn−1. The output signal Sn−1 is not inputted into the gate line GLj, but is inputted into a set terminal S of the following flip-flop Fn as a set signal. The output signal Sn−1 is also inputted into a reset terminal R of a flip-flop Fn−3, which is a flip-flop before a preceding flip-flop of the flip-flop Fn−1, as a reset signal to the flip-flop Fn−3.

Moreover, an output signal Sn is outputted from the output terminal Q of the flip-flop Fn. The output signal Sn is inputted into reset terminals R of flip-flops Fn−1 and Fn−2 as reset signals to the flip-flops Fn−1 and Fn−2, which are respectively (a) a flip-flop before a preceding flip-flop of the flip-flop Fn and (b) the preceding flip-flop of the flip-flop Fn, and into the reset terminal R of the flip-flop Fn as a reset signal to the flip-flop Fn itself.

In the last-stage flip-flop Fn, a delaying circuit 10 is provided between the output terminal Q and the reset terminal R as in Embodiment 1.

Because of this, it is possible for the flip-flop Fn to reset itself after the other flip-flops are reset.

Here, referring to the timing chart shown in FIG. 8, the following further describes the operation of the shift register shown in FIG. 7.

As shown in FIG. 8, the flip-flop F1 is set at a timing at which the clock signal CK rises while the start pulse SP is high level and active. The rest of flip-flops F2 to Fn are set every half cycle of the clock signal CK, thereby the pulse is sequentially shifted.

In other words, the flip-flops F1 to Fn−2 are reset when flip-flops F3 to Fn are set, which are respective flip-flops that are after following flip-flops of the flip-flops F1 to Fn−2, by outputs from the flip-flops F3 to Fn.

Furthermore, right after the last-stage flip-flop Fn outputs the output signal Sn, the last-stage flip-flop Fn is reset by the output signal Sn.

In other words, the last-stage flip-flop Fn is set when an output signal Sn−1 of a flip-flop Fn−1 becomes low. Then, an output signal Sn of a last-stage flip-flop Fn becomes low in synchronization with the clock signal CKB. Then, as described above, the output signal Sn is inputted into the reset terminals R of the flip-flops Fn−2 and Fn−1 and inputted as reset signals to the flip-flops Fn−2 and Fn−1 and into the reset terminal R of the last-stage flip-flop Fn as a reset signal to the last-stage flip-flop Fn itself.

Here, for example, when the flip-flops Fn−2 and Fn−1 are not reset because the last-stage flip-flop Fn stops (is reset) earlier than the flip-flop Fn−1, the flip-flops Fn−2 and Fn−1 keep operating. In such a case, a desired scanning signal cannot be obtained in the gate line GLj corresponding to the flip-flop Fn−2.

However, as described above, by providing the delaying circuit 10 to the shift register, the last-stage flip-flop Fn is reset simultaneously when the flip-flops Fn−2 and Fn−1 are reset, which are respectively (a) the flip-flop that is before the preceding flip-flop of the flip-flop Fn and (b) the preceding flip-flop of the flip-flop Fn, or after the flip-flops Fn−2 and Fn−1 are reset.

In other words, the flip-flop Fn−2 is reset before the last-stage flip-flop Fn is reset.

Because of this, it is possible to prevent malfunctions of the shift register. Therefore, for example, it is possible to provide an image display device in which a desired scanning signal can be obtained because malfunctions do not occur in circuits. As a result, it is possible to provide an image display device of high display quality.

Moreover, the delaying circuit 10 is not limited to that of a particular kind as long as, as described above, the delaying circuit 10 can delay the reset signal R to the last-stage flip-flop Fn outputted from the last-stage flip-flop Fn itself and as long as the as the last-stage flip-flop Fn does not stop operating before the flip-flop Fn−2 (the flip-flop for outputting a scanning signal to a gate line GLj) stops operating.

Here, because the flip-flops F1 to Fn−2 are reset by the reset signals from the two-stage-next flip-flops F3 to Fn, the output signals S1 to Sn−2 from the flip-flops F1 to Fn−2 have output waveform of twice in length compared with that of the flip-flops in Embodiment 1.

For example, when P number of stages of output signals corresponding to the gate line GLj is necessary, the shift register is arranged to have P+(the number of flip-flops reset by the output signal Sn from the last-stage flip-flop Fn except the last-stage flip-flop Fn) stages; that is, the shift register is arranged to have P+2 stages in this example.

Although a case in which one of the plural stages of flip-flops (the first-stage to the n−2 th stage) is reset by an output signal (the reset signal) from the flip-flop that is before the preceding flip-flop thereof is described as an example in this embodiment, the present invention may not be so arranged.

For example, one or some of the plural stages of flip-flops may be reset by an output signal outputted from the flip-flop after more than two stages (Q number of stages) from themselves. In this case, the output signal Sn from the last-stage flip-flop Fn resets the flip-flop Fn itself and those flip-flops before Q number of stages from the flip-flop Fn.

As described above, a shift register of the present embodiment has a plurality of stages (n number of stages) of flip-flops F1 to Fn, some of the plural stages of flip-flops (flip-flops Fn−2 to Fn) including the last-stage flip-flop being reset by inputting an output signal from the last-stage flip-flop Fn into the flip-flops Fn−2 to Fn, wherein the last-stage flip-flop Fn is reset simultaneously when the flip-flops Fn−2 to Fn reset by the output signal from the last-stage flip-flop Fn except the last-stage flip-flop Fn (flip-flops Fn−2 and Fn−1) are reset, or after the flip-flops Fn−2 and Fn−1 are reset.

When the number of flip-flops, including the last-stage flip-flop, reset by the output signal from the last-stage flip-flop Fn is N (three), the flip-flops F1 to Fn except the N number of flip-flops (flip-flops F1 to Fn−3) are reset by inputting output signals from the respective (N−1)th (first) flip-flops as counted forwards from the flip-flops F1 to Fn−3 themselves.

Furthermore, in the shift register, the last flip-flop Fn is reset simultaneously when the flip-flops Fn−2 and Fn−1 are reset, or after the flip-flops Fn−2 and Fn−1 for supplying signals to the driving circuit 2 or to the driving circuit 3 are reset.

Because of this, the last-stage flip-flop Fn is never reset before the flip-flops Fn−2 and Fn−1 are reset. Therefore, it is possible to prevent malfunctions of circuits such as one in which the flip-flops Fn−2 and Fn−1 keep operating because the flip-flops Fn−2 and Fn−1 are not reset.

Therefore, it is possible to provide a display device in which a desired scanning signal can be obtained because malfunctions do not occur in the circuits.

Although the example in the present embodiment shows that the shift register is provided to the driving circuit 3, the present invention may not be so arranged. The present invention may be so arranged that the shift register is provided to the driving circuit 2 or to both of the driving circuits 2 and 3.

Also, the shift register may be of such a kind as to be able to perform scanning in two directions. The following Embodiment 3 describes an arrangement of a shift register that is able to perform scanning in the two directions.

[Embodiment 3]

Referring to FIGS. 1, 2, 9 and 10, the following describes yet another embodiment of the present invention. In the present embodiment, constituents having functions similar to those of the constituents of Embodiment 1 are labeled with the same referential numerals, and explanations thereof are omitted.

The following describes an example of an arrangement of a shift register that is able to perform scanning in two directions. Such shift register that is able to perform scanning in the two directions can realize scanning in horizontal direction in both rightward and leftward directions, if applied to the driving circuit 2 (see FIG. 2). Such shift register that is able to perform scanning in the two directions can also realize scanning in vertical direction in both upward and downward directions, if applied to the driving circuit 3 (see FIG. 2).

Figure 9:
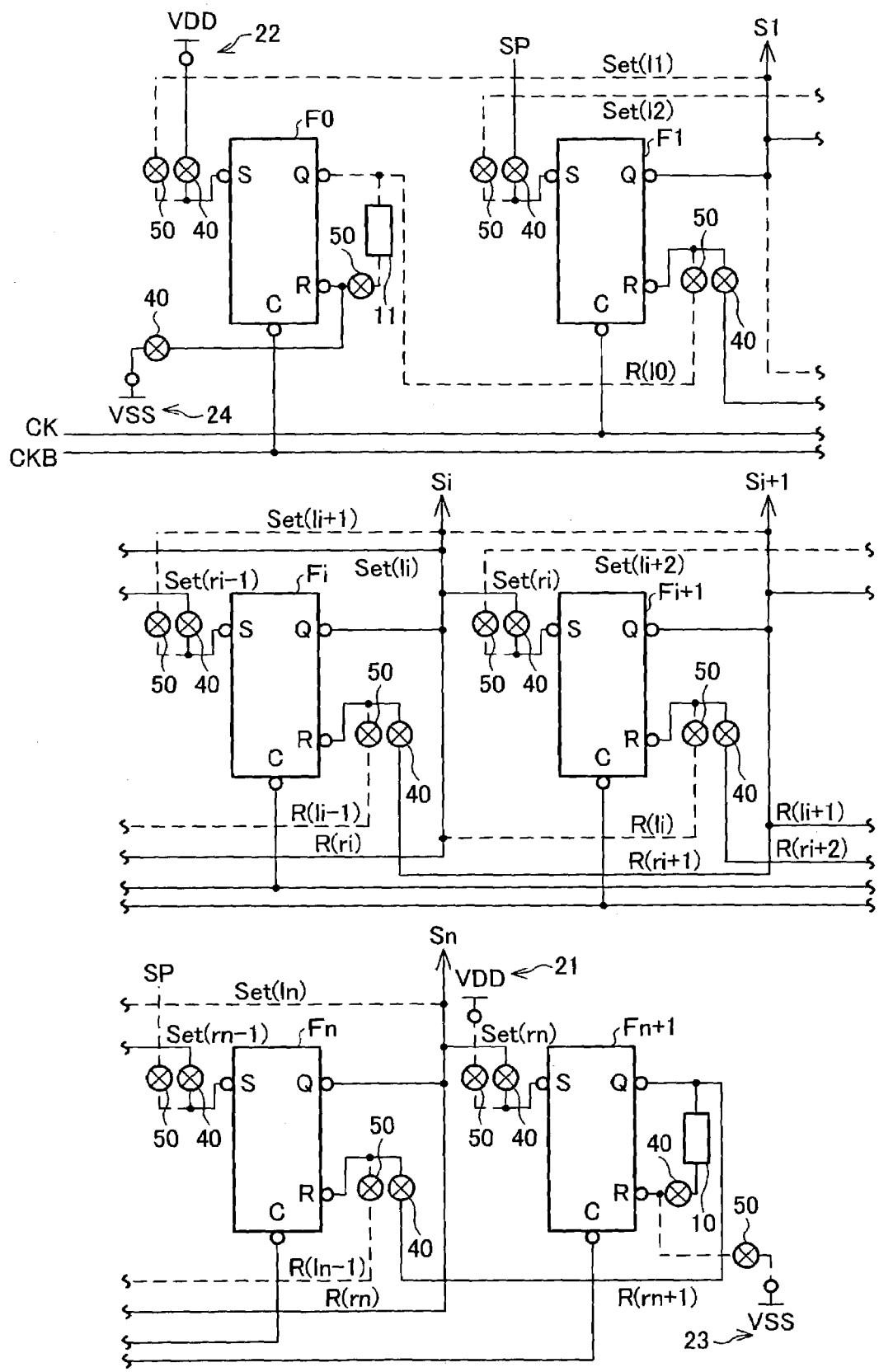
FIG. 9 is a block diagram illustrating an arrangement of a main part of a shift register of yet another embodiment of the present invention.

The shift register shown in FIG. 9 is provided to the driving circuit 2 (see FIG. 2). The shift register includes plural stages of flip-flops (flip-flops F0 to Fn+1) of a set-reset-type (SR flip-flops). The number of flip-flops is not particularly limited as long as the number is plural.

Between a flip-flop F1 and a flip-flop Fn, plural stages of flip-flops having an arrangement similar to those of flip-flops Fi and Fi+1 are provided, thereby enabling the shift register to perform scanning in the two directions (here, rightward and leftward directions).

The flip-flops F0 and Fn+1 at both ends of the shift register are last-stages at the left and at the right, respectively.

When scanning is performed in the rightward direction (r), between an output terminal Q and a reset terminal R of the last-stage flip-flop F+1 (a circuit for a reset signal from the flip-flop F+1 to the flip-flop F+1 itself), a delaying circuit (a delaying means, see Embodiment 1) 10 is provided in order to delay an input of the reset signal to the reset terminal R.

Similarly, when scanning is performed in the leftward direction (l), between an output terminal Q and a reset terminal R of the last-stage flip-flop F0 (a circuit, in the flip-flop F0, for a reset signal to the flip-flop F0 itself), a delaying circuit (a delaying means) 11 having the same arrangement with the above delaying circuit 10 is provided in order to delay an input of the reset signal to the reset terminal R.

Moreover, set terminals S and reset terminals R of the flip-flops F0 to F+1 are connected to circuits which function as analog switches (hereinafter switches) 40 and 50.

One of the switches 40 and 50 is opened in accordance with a scanning-direction-control signal inputted from the controlling section 4 (see FIG. 2) into the shift register. Because of this, the scanning direction is switched, and signals (start pulse and clock signals) are inputted into the flip-flops corresponding to the scanning direction.

It is necessary for the shift register to include the switches 40 and 50 therein for input of signals in accordance with the scanning directions in order to realize the scanning in the two directions because a set terminal S and a reset terminal R of a flip-flop Fi do not function as independent input terminals corresponding only to a particular direction. In other words, the arrangement does not have separate sets of input terminals for each of the rightward and leftward scanning directions.

For example, when the switch 40 is opened, the scanning is performed in the rightward direction because the circuit is electrically disconnected by the switch 50 while electrically connected by the switch 40. In this case, the start pulse SP is inputted into the flip-flop F1 and sequentially shifted. In short, the start pulse SP operates in a manner similar to the flip-flops F1 to Fn shown in FIG. 1. The flip-flop Fn+1 shown in FIG. 9 that corresponds to the flip-flop Fn shown in FIG. 1 resets the flip-flops F+1 and Fn.

The last-stage flip-flops F0 and Fn+1 are provided with power sources. The set terminal S of the flip-flop F0 is connected to a power source 22 via the switch 40; the reset terminal R of the flip-flop F0 is connected to a power source 24 via the switch 40. The set terminal S of the flip-flop Fn+1 is connected to a power source 21 via the switch 50; the reset terminal R of the flip-flop Fn+1 is connected to a power source 23 via the switch 50.

The power sources (stopping means) 21 and 22 supply power of a high (positive) side, thereby causing, to be constant at VDD (predetermined potential; fixed potential), potential of the signal that is to be inputted into the set terminal S (the set signal). The power sources (stopping means) 23 and 24 supply power of a low (negative) side, thereby causing, to be constant at VSS (predetermined potential, fixed potential), potential of the signal that is to be inputted into the reset terminal R (the reset signal).

Here, the set signals Set (Set (l1 to ln), Set (r1 to rn)) shown in FIG. 9 are the output signals S1 to Sn outputted from the output terminals Q of the flip-flops F1 to Fn, and are inputted into set terminals S of the following flip-flops.

The reset signals R (R(l0 to ln−1), R(r2 to rn+1)) shown in FIG. 9 are signals outputted from reset terminals R of the flip-flops F0 to Fn−1 (when the scanning direction is the leftward direction) and the flip-flops F2 to Fn+1 (when the scanning direction is the rightward direction). The reset signals R (R(l0 to ln−1), R(r2 to rn+1)) reset preceding flip-flops.

Arguments of the set signal Set and the reset signal R describe the scanning direction (right (r) or left (l)) and the flip-flops from which the signals are outputted. For example, in a set signal Set (li+1), "l" describes that the scanning direction is the leftward direction, and "i+1" describes that "i+1" is an output from the flip-flop Fi+1. In short, when the scanning direction is the leftward direction, the set signal Set (li+1) is outputted from the output terminal Q of the flip-flop Fi+1, and inputted into the set terminal S of the following flip-flop Fi.

FIG. 9 shows wires electrically connected by the switch 40 when the scanning direction is the rightward direction by continuous lines and wires electrically connected by the switch 50 when the scanning direction is the leftward direction by dotted lines. In short, the shift register of the present embodiment have an arrangement that realizes, in the two directions, the shift register including the arrangement described in Embodiment 1.

The following describes the case in which the scanning direction is the leftward direction (l) as an example of the operation of the shift register.

In the case in which the scanning direction is the leftward direction (shown by the dotted lines in the figure), the pulse is sequentially shifted in the leftward direction by Fn to F1 in accordance with the clock signal CK when the start pulse SP is inputted into the flip-flop Fn. In other words, the flip-flops Fn to F1 are reset by outputs of the flip-flops Fn−1 to F0 when the flip-flops Fn−1 to F0 are set. The last-stage flip-flop F0 is reset by the output signal of the flip-flop F0 itself.

Thus, when the scanning direction is the leftward direction, the flip-flop Fn+1 does not contribute to driving of the shift register. Therefore, in the shift register, the flip-flop Fn+1 is connected to the power sources 21 and 23 so that the flip-flop Fn+1, which does not contribute to driving of the shift register, does not operate.

Here, operation of the flip-flop Fn+1 is described, taking as a comparative example an arrangement in which the flip-flop Fn+1, which does not contribute to the driving of the shift register, is not connected to the power sources 21 and 23.

Figure 10:
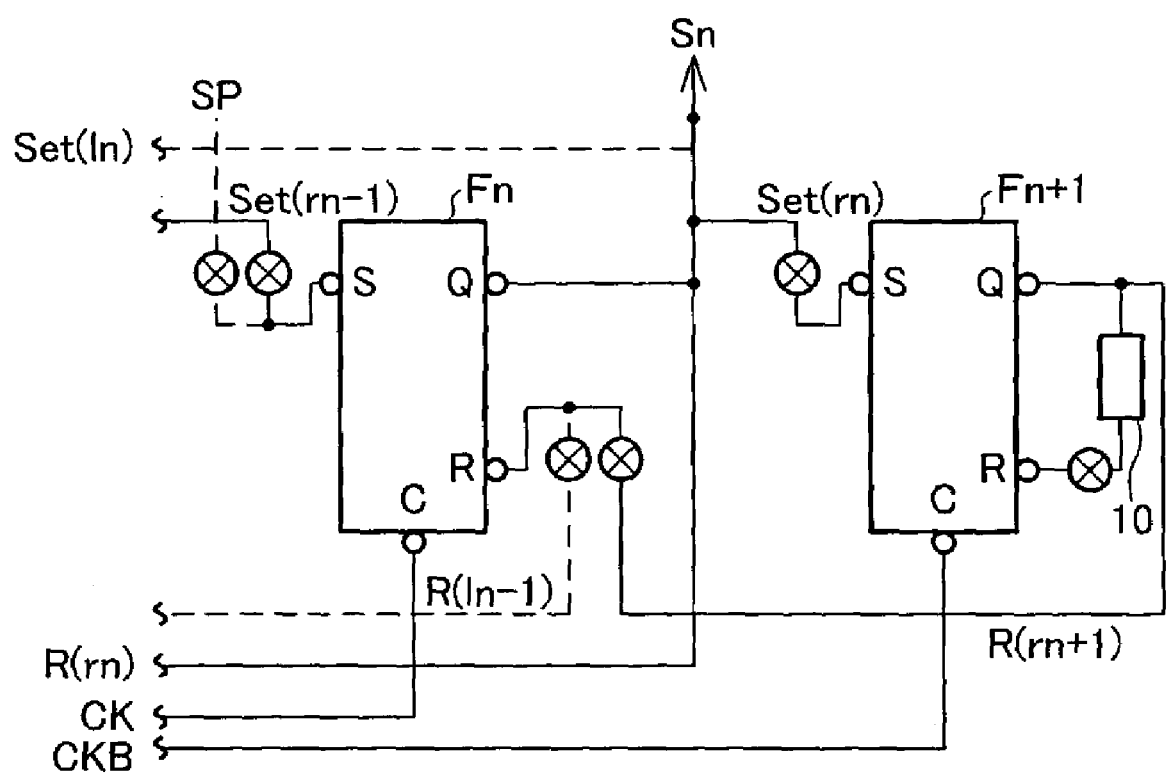
FIG. 10 illustrates an arrangement of a flip-flop that is a last-stage in a case of scanning in a rightward direction in a comparative example.
Figure 11:
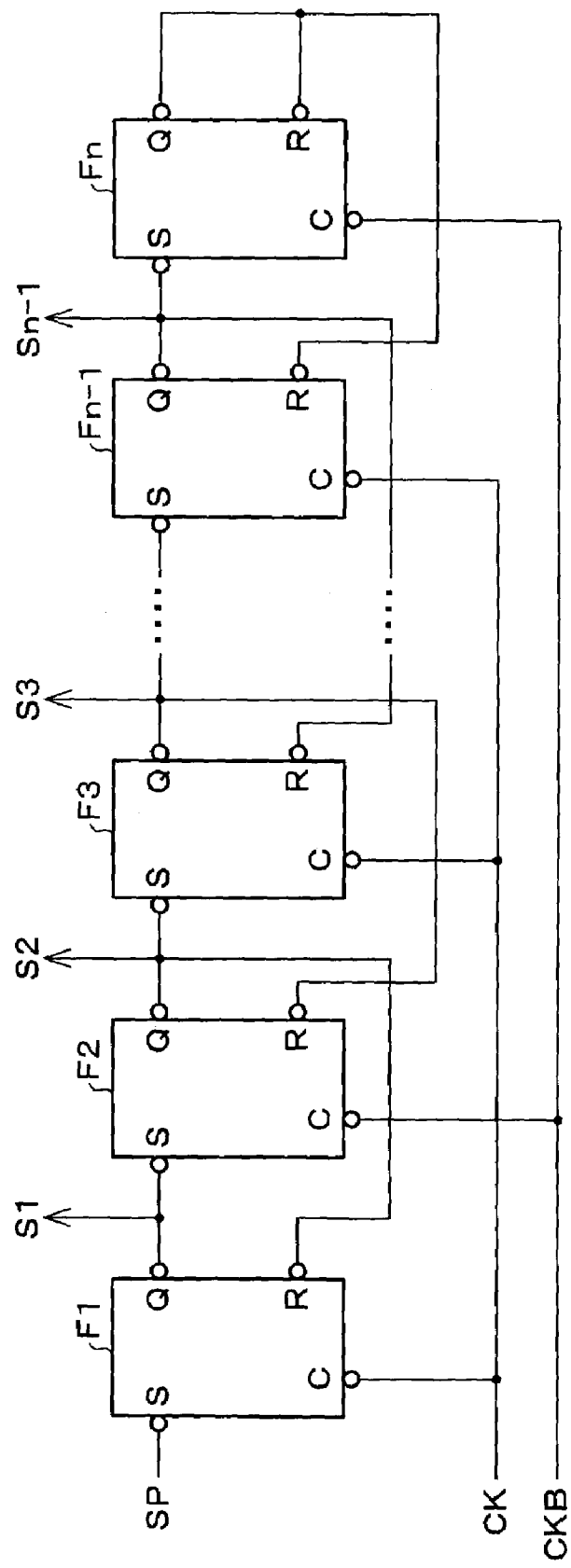
FIG. 11 is a block diagram illustrating an arrangement of a conventional shift register.
Figure 12:
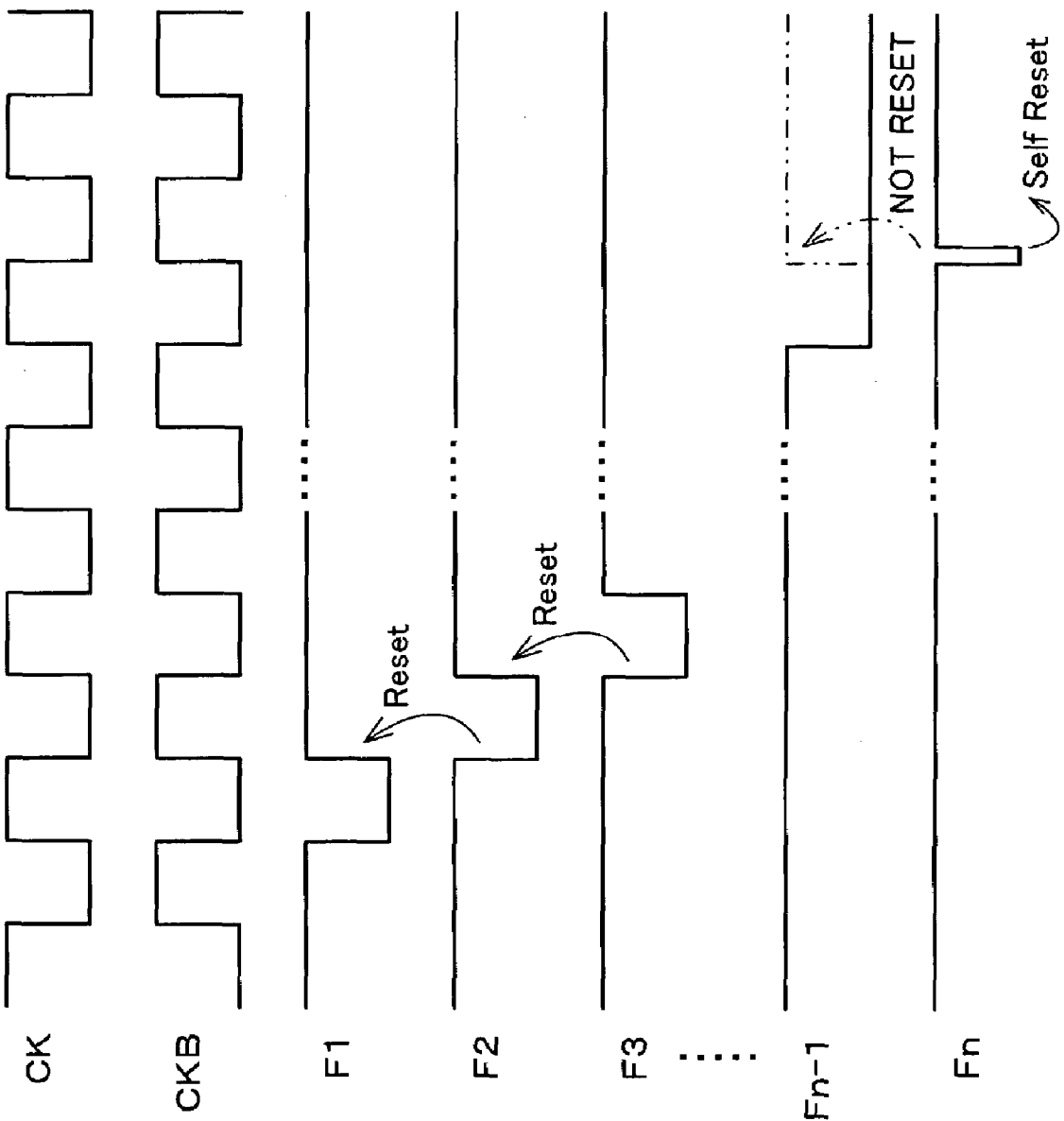
FIG. 12 is a timing chart illustrating operation of the conventional shift register.

FIG. 10 shows a circuit arrangement of the flip-flop Fn+1 in the comparative example. As shown in the figure, the flip-flop Fn+1 only has a circuit having a set terminal S and a reset terminal R provided with a switch for scanning in the rightward direction, because the flip-flop Fn+1 does not contribute to driving of the scanning in the leftward direction.

In the comparative example, the operation of the flip-flop Fn+1 are stopped by closing the switch of the flip-flop Fn+1 when the scanning direction is the leftward direction, and the operation of the flip-flop Fn+1 are stopped by opening the switch of the flip-flop Fn+1 when the scanning direction is the rightward direction. Thus, it is possible to ensure that the set signal from the flip-flop Fn is not inputted into the flip-flop Fn+1 when the scanning direction is the leftward direction.

In such arrangement, when the scanning direction is the leftward direction, floated are the set terminal S and the reset terminal R of the flip-flop Fn+1 because the flip-flop Fn+1 is shutted down because the switch is closed by the scanning-direction-control signal.

When the input terminals are floated, potential of the input terminals becomes unstable, and there is a fear that at certain moment the flip-flop Fn+1 is set and starts operating.

In this case, the flip-flop Fn+1 is reset by its self-reset function, right after the flip-flop Fn+1 is set and starts operating again. However, the flip-flop Fn+1 is then floated again. Thus, the flip-flop Fn+1 is set again. There is a fear that the flip-flop Fn+1 always keeps operating because the setting and resetting are repeated.

Moreover, every time the flip-flop Fn+1 is set, the flip-flop Fn+1 moves in order to input the reset signal into the reset terminal R of the preceding flip-flop Fn. Because of this, there is a fear that malfunctions of the circuits occur despite the switches, which are selecting circuits for the reset signal, are provided.

Furthermore, there is a fear that, because the input signal is floated, voltage supplied to gates of transistors to which the set signal is inputted in the flip-flop Fn+1 becomes intermediate potential and that gate-source voltages oscillate in a high frequency.

Because of this, the transistors become less tolerant to pressure. This finally leads to break down of the transistors. When the broken transistors continue to supply current, for example, in case of the scanning in the rightward direction, a malfunction occurs in which the last-stage flip-flop Fn+1 is kept being set.

Alternatively, when the broken transistors become completely unable to supply current, in case of the scanning in the rightward direction, a malfunction occurs in which the preceding flip-flop Fn does not stop operating because the last-stage flip-flop Fn+1 is not set.

Thus, by the transistors becoming less tolerant to pressure, the last-stage flip-flop no longer operates as the shift register. In other words, when the transistors become less tolerant to pressure and finally break down, the shift register looses function of the shift register.

However, because the present shift register includes, at the flip-flop Fn+1, the power sources 21 and 23 as shown in FIG. 9, the present shift register is capable of keeping constant (firmly maintaining) potential of the signals that are to be inputted into the set terminal S and the reset terminal R.

Therefore, it is possible to avoid the floating because current can be stably supplied, in accordance with the scanning-direction-control signal, to the flip-flop Fn+1 which is not electronically connected due to the switch 40 when the scanning is performed in the leftward direction.

In other words, in case of the scanning in the leftward direction, the set signal is kept non-active by continually supplying VDD to the set terminal S of the flip-flop Fn+1 via the power source 21, which is a power source on a positive side of the driving circuit. Because of this, it is possible to ensure that the flip-flop Fn+1 is not set. Therefore, the flip-flop Fn+1 never operates in case of the scanning in the leftward direction.

Also, the reset signal is kept active by continually supplying VSS to the reset terminal R of the flip-flop Fn+1 via the power source 23, which is the power source in the negative side of the driving circuit. Because of this, the flip-flop Fn+1 can stop even if the flip-flop Fn+1 is set by any chance, because the flip-flop Fn+1 is reset.

In case of the scanning in the rightward direction, the flip-flop F0 has an arrangement similar to that of the flip-flop Fn+1 and operates in a manner similar to that of the flip-flop Fn+1; the power source 22 operates in a manner similar to that of the power source 21; and the power source 24 operates in a manner similar to that of the power source 23.

The firmly maintained potential of the signals that are to be inputted to the set terminals S and the reset terminals R is not particularly limited as long as the firmly maintained potential causes the set signal to be non-active and the reset signal to be active.

Furthermore, the number of flip-flops reset by the last-stage flip-flops F0 and Fn+1 as well as the last-stage flip-flops F0 and Fn+1 themselves is not particularly limited.

For example, as described in Embodiment 2, when an output from the last stage flip-flop in the scanning direction resets the last-stage flip-flop, the preceding flip-flop of the last-stage flip-flop, and the two-stage-preceding flip-flop of the last-stage flip-flop, a shift register may have an arrangement in which the scanning in two directions can be performed by providing power sources (the power sources 21 and 23) similar to those of the flip-flop Fn+1 shown in FIG. 9 to the last-stage flip-flop and the preceding flip-flop thereof in each scanning direction (flip-flops that output no signal out of the shift register), in order to attain an effect similar to that of the shift register shown in FIG. 9.

Moreover, although the shift register is provided with the delaying circuits 10 and 11 (the delaying means) in the present embodiment, this is not always necessary. For example, an arrangement shown in FIG. 9 in which the delaying circuits 10 and 11 are not provided may prevent malfunctions from occurring in the circuits.

Specifically, according to the arrangement above, the flip-flops that output no signal out of the shift register (for example, the flip-flops that do not contribute to the operation of the shift register in each scanning direction (the flip-flop F0 in case of the scanning in the rightward direction and the flip-flop Fn+1 in case of the scanning in the leftward direction)) never operate. Moreover, the transistors to which the signals are inputted properly operate because the input terminals (the set terminals and the reset terminals) of the above flip-flops never become floating.

As described above, the present shift register is able to perform scanning in the two directions by using the same plurality of flip-flops, and includes the power sources 21 to 24 so that the flip-flops F0 and Fn+1 that output no signal out of the shift register among the plural stages of flip-flops (the flip-flops F0 to Fn+1) do not operate.

Because of this, the flip-flops that output no signal out of the shift register (the flip-flops that do not contribute to driving of the shift register; the flip-flops F0 to Fn+1) never operate.

Moreover, for example, the transistors to which the signals are inputted properly operate because the input terminals (the set terminals and the reset terminals) of the flip-flops that do not contribute to driving of the shift register (the flip-flop F0 in case of the scanning in the rightward direction and the flip-flop Fn+1 in case of the scanning in the leftward direction) are never floated. Therefore, it is possible to prevent malfunctions from occurring in the circuits, such as one in which the preceding flip-flops F1 and Fn cannot be reset.

The power sources 21 and 22 are for firmly maintaining the set signals to predetermined potential so as to make the set signals for setting the flip-flops F0 and Fn+1 non-active; the power sources 23 and 24 are for firmly maintaining the reset signals to predetermined potential so as to make the reset signals for resetting the flip-flops F0 and Fn+1 active.

Because of the power sources, it is possible to keep the set signals always non-active and the reset signals always active. Therefore, it is possible to prevent malfunctions of the circuits because the flip-flops F0 and Fn+1, which do not contribute to driving of the shift register, never operate.

Moreover, each of the flip-flops F0 to Fn+1 has the switches 40 and 50 for switching the scanning directions.

Because of the switches 40 and 50, it is possible to realize scanning in the two directions with such a simple arrangement in which only one set of plural stages of flip-flops is used for both scanning directions. Moreover, in the arrangement in which the flip-flops F0 and Fn+1, which do not contribute to driving of the shift register, are provided at both ends of the shift register, it is possible to switch the scanning directions so that the flip-flop Fn+1 (the rightmost flip-flop) does not operate in case of the scanning in the leftward direction, and so that the flip-flop F0 (the leftmost flip-flop) does not operate in case of the scanning in the rightward direction.

The present invention is not limited to the embodiments described above; the same may be varied in many ways. Variations that may be obtained by combining, as appropriate, technologies disclosed in different embodiments are included within the scope of the following claims.

As described above, a shift register of the present embodiment includes plural stages of flip-flops, some of the flip-flops and the last-stage flip-flop being reset by inputting thereto an output signal from the last-stage flip-flop, wherein the last-stage flip-flop is reset at same time or after the some of the flip-flops are reset.

For example, the shift register of the present invention includes plural stages of flip-flops, the last-stage flip-flop and the preceding flip-flop thereof being reset by inputting thereto an output signal from the last-stage flip-flop, wherein the last-stage flip-flop is reset at same time or after the preceding flip-flop thereof is reset.

Specifically, it is preferable that the above shift register includes a delaying means, positioned between an output terminal of the last-stage flip-flop for outputting the output signal and an input terminal of the last-stage flip-flop for receiving the output signal, for delaying an input of the output signal to the input terminal.

According to the arrangement above, the last-stage flip-flop is never reset before the other flip-flops (for example, the one-stage-preceding flip-flop of the last-stage flip-flop). Therefore, it is possible to prevent malfunctions, for example, such a malfunction in which the other flip-flops (for example, the one-stage-preceding flip-flop of the last-stage flip-flop) keeps operating without being reset.

Therefore, for example, it is possible to provide a display device including the above shift register in a data driving circuit, a gate driving circuit, and the like, wherein a desired sampling waveform, a desired scanning signal, and the like can be obtained because malfunctions do not occur in the circuits.

Moreover, a shift register of the present invention includes plural stages of flip-flops, some of the plural stages of flip-flops and the last-stage flip-flop being reset by inputting thereto an output signal from the last-stage flip-flop, wherein the same plural stages of flip-flops are capable of scanning in two directions, and one or some of the flip-flops that output no signal out of the shift register include a stopping means for preventing itself from operating.

According to the arrangement above, the flip-flops that output no signal out of the shift register (for example, the leftmost flip-flop in case of the scanning in the rightward direction) never operate. Moreover, the transistors to which the signals are inputted properly operate because the input terminals (set terminals and reset terminals) of the flip-flops at the ends (for example, the leftmost flip-flop in case of the scanning in the rightward direction) are never floated.

It is preferable that, in the above shift register, the last-stage flip-flop in each scanning direction is reset at same time or after the some of the plural stages of flip-flops except the last-stage flip-flop is reset.

According to the arrangement above, the last-stage flip-flop in each scanning direction is never reset before the other flip-flops are reset. Therefore, it is possible to prevent malfunctions of the circuits such as one in which the other flip-flops keep operating without being reset.

It is preferable that, in the above shift register, the delaying means is a CMOS inverter, and delaying time is set in accordance with at least one of channel width and channel length of a transistor in the CMOS inverter.

Here, the delaying time is a gap between an input timing of the output signal from the last-stage flip-flop to the input terminal thereof when the delaying means is not provided and an input timing of the output signal from the last-stage flip-flop to the input terminal thereof when the delaying means is provided; in other words, delay of the output signal (the reset signal) caused by providing the delaying means.

According to the arrangement above, it is possible to obtain a desired delaying time by adjusting at least one of the channel width and the channel length of the transistor in the CMOS inverter.

It is preferable that, in the above shift register, the delaying means is a wire capacitor, and delaying time is set in accordance with capacitance of the wire capacitor.

According to the arrangement above, it is possible to obtain a desired delay time by appropriately arranging the wire capacitor, for example, in terms of length, cross-sectional area, and material thereof.

It is preferable that, in the above shift register, the delaying means is a wire resistor, and delaying time is set based on resistance of the wire resistor.

According to the arrangement above, it is possible to obtain a desired delay time by appropriately arranging the wire resistor, for example, in terms of length, cross-sectional area, and material thereof.

The delaying means may be composed of by arbitrarily combining the CMOS inverter, the wire capacitor, and the wire resistor.

It is preferable that, in the above shift register, each of the plural stages of flip-flops except the some of the flip-flops and the last-stage flip-flop is reset by inputting thereto an output signal from the (N−1)th flip-flop as counted forwards from itself, where N is the sum of the number of the some of the flip-flops and the last-stage flip-flop.

For example, it is preferable that each of the plural stages of flip-flops except the last-stage flip-flop is reset by inputting thereto an output signal from the following flip-flop thereof.

According to the arrangement above, it is possible to use the output signals of the plural stages of flip-flops as the reset signals. Moreover, by using the delaying means, for example, so as to delay the timing at which the last-stage flip-flop is reset, the last-stage flip-flop is never reset before the other flip-flops are reset. Therefore, it is possible to prevent malfunctions of the circuits, for example, such a malfunction in which the other flip-flops keep operating without being reset.

It is preferable that, in the above shift register, the stopping means is a power source for firmly maintaining to respective predetermined potentials (i) a set signal being for setting the one or some of the flip-flops that output no signal out of the shift register, so as to cause the set signal to be non-active, and (ii) a reset signal being for resetting the one or some of the flip-flops that output no signal out of the shift register, so as to cause the reset signal to be active.

According to the arrangement above, it is possible to keep the set signals always non-active and the reset signal always active. Therefore, it is possible to prevent the flip-flops from operating because the set signal is always kept non-active. Furthermore, the flip-flops are reset even if the set signal becomes active because the reset signal is always kept active. As a result, the flip-flops having the above power source never operate, thereby ensuring that malfunctions of the circuits do not occur.

It is preferable that, in the above shift register, each flip-flop includes a scanning direction switching means for switching scanning directions.

According to the arrangement above, it is possible to enable scanning in two directions with such a simple arrangement in which only one set of flip-flops are used for both scanning directions.

A display device of the present invention includes a plurality of gate lines, a plurality of data lines positioned orthogonal to the plurality of gate lines, switching elements provided in vicinities of intersections between the plurality of gate lines and the plurality of data lines, each of the switching elements corresponding to a pixel, a gate driving circuit for supplying a scanning signal for driving pixels to the plurality of gate lines, and a data driving circuit for supplying a data signal for the pixels to the plurality of data lines, at least one of the gate driving circuit and the data driving circuit including the above shift register.

According to the arrangement above, it is possible, for example, when the gate driving circuit includes the shift register, to reset all of the plural stages of flip-flops in the shift register in the gate driving circuits. Thus, it is possible to prevent the preceding flip-flops of the last-stage flip-flop from keeping operating due to malfunctions of the circuit.

Therefore, it is possible to obtain a desired scanning signal for driving the pixels to the last gate line corresponding to the outputs from the preceding flip-flops of the last-stage flip-flop (the gate line that receives a last scanning signal in one frame period).

Moreover, it is possible, for example, when the data driving circuit includes the shift register, to reset all of the plural stages of flip-flops in the shift register in the data driving circuits. Thus, it is possible to prevent the preceding flip-flops of the last-stage flip-flop from keeping operating due to malfunctions of the circuit.

Therefore, it is possible to obtain a desired sampling waveform of the data signal in the last data line corresponding to the outputs from the preceding flip-flops of the last-stage flip-flop.

Furthermore, by providing the above shift register to at least one of the gate driving circuit and the data driving circuit, it is possible to attain lower electronic power consumption of the display device. Moreover, because a circuit size in the shift register can be reduced, it is possible to reduce a size of a frame portion of the display device.

It is preferable that, in the above display device, the switching elements and at least one of the gate driving circuit and the data driving circuit are provided on a single substrate.

According to the arrangement above, by providing, on the same substrate on which the switching elements are provided, signal wires (for example, data lines and gate lines) between the driving circuit and the pixels (the switching elements), it is unnecessary to extend the signal wires out of the substrate even if the number of signal wires are increased, because the signal wires are provided on the same substrate. Moreover, steps of preparing the driving circuit and the switching elements on separate substrates and assembling the substrates are no longer necessary.

Therefore, it is possible to reduce signal wire capacitance and manufacturing steps of the display device.

It is preferable that, in the above display device, the substrate is made of glass.

According to the arrangement above, it is possible to use an inexpensive glass substrate as the substrate. Moreover, it is possible to easily manufacture a substrate having large area from the glass substrate. Because of this, a large number of panels can be manufactured from the single substrate having large area. Therefore, it is possible to provide an inexpensive image display device.

It is preferable that, in the above display device, the switching elements are made of polycrystalline silicon.

According to the arrangement above, it is possible to enlarge area of the display section of the display device.

It is preferable that, in the above display device, the switching elements are formed at a process temperature of 600° C. or lower.

According to the arrangement above, even if a typical glass substrate is used, a distortion temperature of which is 600° C. or lower, it is possible to prevent warpage and bowing of the substrate due to a process temperature of more than the distortion temperature.

Therefore, it is possible to provide a display device that is easy to mount on a substrate and that has a display section having large area.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A shift register comprising:
    plural stages of flip-flops, at least one of the flip-flops and the last-stage flip-flop being reset by inputting to respective input terminals thereof an output signal from an output terminal of the last-stage flip-flop,
    a delaying circuit provided between the output terminal of the last-stage flip-flop and the input terminal of the last-stage flip-flop, the delaying circuit for delaying inputting of the output signal to the input terminal of the last-stage flip-flop, and
    wherein the last-stage flip-flop is reset at same time or after the at least one flip-flop is reset.

2. The shift register of claim 1, wherein the delaying circuit comprises a CMOS inverter.

3. The shift register of claim 1, wherein a delaying time of the delay circuit is set in accordance with at least one of channel width and channel length of a transistor in the CMOS inverter.

4. The shift register of claim 1, wherein the delaying circuit comprises a wire capacitor, and a delaying time of the delay circuit is set in accordance with a capacitance of the wire capacitor.

5. The shift register of claim 1, wherein the delaying circuit comprises a wire resistor.

6. The shift register of claim 1, wherein the delaying circuit is provided between the output terminal of the last-stage flip-flop and the input terminal of the last-stage flip flop, but not between the output terminal of the last-stage flip-flop and a reset or input terminal of the at least one flip-flop that is also reset by the output signal from the last-stage flip-flop, so that the output signal from the last stage flip-flop passes through the delay circuit before resetting the last-stage flip-flop but does not pass through the delay circuit before resetting the at least one flip-flop.

7. The shift register of claim 1, wherein the delaying circuit is not between the output terminal of the last-stage flip-flop and the respective input terminals of the at least one of the flip-flops.

8. The shift register of claim 7, wherein the output signal passes through the delaying circuit before resetting the last-stage flip-flop, but does not pass through the delaying circuit before resetting the at least one flip-flop.

9. A shift register comprising:
plural stages of flip-flops, at least one of the flip-flops and the last-stage flip-flop being reset by inputting thereto an output signal from the last-stage flip-flop;
wherein the last-stage flip-flop is reset at same time or after said at least one of the flip-flops is/are reset; and
wherein each of the plural stages of flip-flops except the at least one of the flip-flops and the last-stage flip-flop is reset by inputting thereto an output signal from the (N−1)th flip-flop as counted forwards from itself, where N is the sum of the number of the at least one of the flip-flops and the last-stage flip-flop.

10. A shift register as set forth in claim 9, further comprising: a delaying means, positioned between an output terminal of the last-stage flip-flop for outputting the output signal and an input terminal of the last-stage flip-flop for receiving the output signal, for delaying an input of the output signal to the input terminal.

11. The shift register as set forth in claim 10, wherein:
the delaying means is a CMOS inverter; and
delaying time is set in accordance with at least one of channel width and channel length of a transistor in the CMOS inverter.

12. The shift register as set forth in claim 10, wherein:
the delaying means is a wire capacitor; and
the delaying time is set in accordance with capacitance of the wire capacitor.

13. The shift register as set forth in claim 10, wherein:
the delaying means is a wire resistor; and
the delaying time is set in accordance with capacitance of the wire resistor.

14. A shift register comprising:
plural stages of flip-flops, the last-stage flip-flop and the preceding flip-flop thereof being reset by inputting to respective input terminals thereof an output signal from an output terminal of the last-stage flip-flop,
a delaying circuit between the output terminal of the last-stage flip-flop and the input terminal of the last-stage flip-flop, the delaying circuit for delaying inputting of the output signal to the input terminal of the last-stage flip-flop, and
wherein the last-stage flip-flop is reset at same time or after the preceding flip-flop thereof is reset.

15. The shift register as set forth in claim 14, wherein:
the delaying circuit comprises a CMOS inverter; and
delaying time is set in accordance with at least one of channel width and channel length of a transistor in the CMOS inverter.

16. The shift register as set forth in claim 14, wherein:
the delaying circuit comprises a wire capacitor; and
delaying time is set in accordance with capacitance of the wire capacitor.

17. The shift register as set forth in claim 14, wherein:
the delaying circuit comprises a wire resistor; and
delaying time is set in accordance with capacitance of the wire resistor.

18. The shift register as set forth in claim 14, wherein:
each of the plural stages of flip-flops except the last-stage flip-flop is reset by inputting thereto an output signal from the following flip-flop thereof.

19. The shift register of claim 14, wherein the delaying circuit is not between the output terminal of the last-stage flip-flop and the input terminal of the preceding flip-flop.

20. The shift register of claim 19, wherein the output signal passes through the delaying circuit before resetting the last-stage flip-flop, but does not pass through the delaying circuit before resetting the preceding flip-flop.

* * * * *